United States Patent
Murakami

(10) Patent No.: US 9,230,955 B2
(45) Date of Patent: Jan. 5, 2016

(54) INTEGRATED CIRCUIT AND WIRELESS COMMUNICATION APPARATUS

(71) Applicant: SAMSUNG ELECTRO-MECHANICS CO., LTD., Suwon, Gyunggi-do (JP)

(72) Inventor: Tadamasa Murakami, Yokohama (JP)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 430 days.

(21) Appl. No.: 13/841,965

(22) Filed: Mar. 15, 2013

(65) Prior Publication Data

US 2013/0241033 A1     Sep. 19, 2013

(30) Foreign Application Priority Data

Mar. 16, 2012 (JP) ................. 2012-060421

(51) Int. Cl.
H03K 17/687 (2006.01)
H01L 27/02 (2006.01)
G11C 19/18 (2006.01)

(52) U.S. Cl.
CPC .......... *H01L 27/0288* (2013.01); *G11C 19/184* (2013.01)

(58) Field of Classification Search
None
See application file for complete search history.

(56) References Cited

U.S. PATENT DOCUMENTS

| | | | |
|---|---|---|---|
| 6,013,958 A | 1/2000 | Aytur | |
| 8,604,864 B2 * | 12/2013 | Ranta | H03M 1/1061 327/427 |
| 9,106,227 B2 * | 8/2015 | Ranta | H03M 1/1061 327/427 |
| 2003/0058669 A1 | 3/2003 | Myono | |
| 2008/0265978 A1 * | 10/2008 | Englekirk | H03K 17/102 327/427 |
| 2012/0217822 A1 | 8/2012 | Nakamoto | |

FOREIGN PATENT DOCUMENTS

| | | |
|---|---|---|
| JP | 54-152841 A | 12/1979 |
| JP | 2000-68452 A | 3/2000 |
| JP | 2003-111386 A | 4/2003 |

(Continued)

OTHER PUBLICATIONS

Japanese Office Action issued on Nov. 5, 2015 in counterpart Japanese Application No. 2012-060421 (7 pages, Japanese with English translation).

*Primary Examiner* — Long Nguyen
(74) *Attorney, Agent, or Firm* — NSIP Law

(57) ABSTRACT

An element can be prevented from being damaged even when a high level signal is input to an integrated circuit having a variable capacitance element whose capacitance is variable by digital signal control. There is provided an integrated circuit including b sub-circuits (b is an integer equal to or greater than 1) that are connected in series between a first terminal and a second terminal and have capacitance $2^{b-1}$ times larger than predetermined unit capacitance. The b-th sub-circuit includes $2^{b-1}$ configurations, which are connected in parallel, each including at least two capacitors connected in series and at least two stacked switch elements. At least the two stacked switch elements are operated to all switched for each sub-circuit, and at least one switch element of at least the two stacked switch elements is provided between at least the two capacitors.

4 Claims, 6 Drawing Sheets

(56) References Cited

FOREIGN PATENT DOCUMENTS

| | | |
|---|---|---|
| JP | 2011-40811 A | 2/2011 |
| JP | 2011-515832 A | 5/2011 |
| JP | 2012-175594 A | 9/2012 |
| WO | WO-2009/108391 A1 | 9/2009 |

* cited by examiner

INTEGRATED CIRCUIT AND WIRELESS COMMUNICATION APPARATUS

CROSS-REFERENCE TO RELATED APPLICATIONS

This application claims the priority of Japanese Patent Application No. 2012-060421 filed on Mar. 16, 2012, in the Japanese Patent Office, the disclosure of which is incorporated herein by reference.

BACKGROUND OF THE INVENTION

1. Field of the Invention

The present invention relates to an integrated circuit and a wireless communication apparatus.

2. Description of the Related Art

There has been used a capacitor storing electric charges in an electronic device. In general, the capacitor basically has two conductive plates divided by an insulator. The capacitor has been used in a plurality of electronic circuits including a filter, an analog and digital converter, a memory element, various types of control devices, a power amplifier, and an adjustable matching circuit.

In a wireless communication apparatus such as a cellular phone, there is a need for realizing a variable capacitance element that withstands a high level signal and has high Q-value to adjust impedance of an antenna. By way of example, there has been suggested a variable capacitance element of a digital signal control type realized by providing a MIM (Metal Insulation Metal) capacitance of high linearity and a transistor switch on a semiconductor (see, for example, Patent Document 1).

Patent Document 1: Japanese Translation of PCT International Application No. 2011-515832

Unfortunately, in the variable capacitance element described in Patent Document 1, when a high level signal having amplitude of 10V to 15V is input, since a high voltage is applied to a capacitor close to an RF terminal, there is a problem that the capacitor may be damaged.

SUMMARY OF THE INVENTION

In view of the foregoing, an aspect of the present invention is to provide a novel and improved integrated circuit and a wireless communication apparatus, capable of preventing an element from being damaged even when a high level signal is input to an integrated circuit having a variable capacitance element whose capacitance is variable by digital signal control.

In order to solve the problems, according to an aspect of the present invention, there is provided an integrated circuit including b sub-circuits (b is an integer equal to or greater than 1) that are connected in series between a first terminal and a second terminal and have capacitance $2^{b-1}$ times larger than predetermined unit capacitance. The b-th sub-circuit includes $2^{b-1}$ configurations, which are connected in parallel, each including at least two capacitors connected in series and at least two stacked switch elements, at least the two stacked switch elements are operated to all switched for each sub-circuit, and at least one switch element of at least the two stacked switch elements is provided between at least the two capacitors.

In such a configuration, b sub-circuits have capacitance $2^{b-1}$ times larger than predetermined unit capacitance connected in parallel between the first terminal and the second terminal. The b-th sub-circuit includes $2^{b-1}$ configurations, which are connected in parallel, each including at least two capacitors connected in series and at least two stacked switch elements, at least the two stacked switch elements are operated to all switched for each sub-circuit, and at least one switch element of at least the two stacked switch elements is provided between at least the two capacitors. As a result, the integrated circuit can prevent the element from being damaged even when a high level signal is input to the integrated circuit having the variable capacitance element whose capacitance is variable by digital signal control.

One of at least the two capacitors may be provided at a position closest to the first terminal.

The second terminal may be connected to ground potential.

In addition, in order to solve the problem, according to another aspect of the present invention, there is provided a wireless communication apparatus including the integrated circuit.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
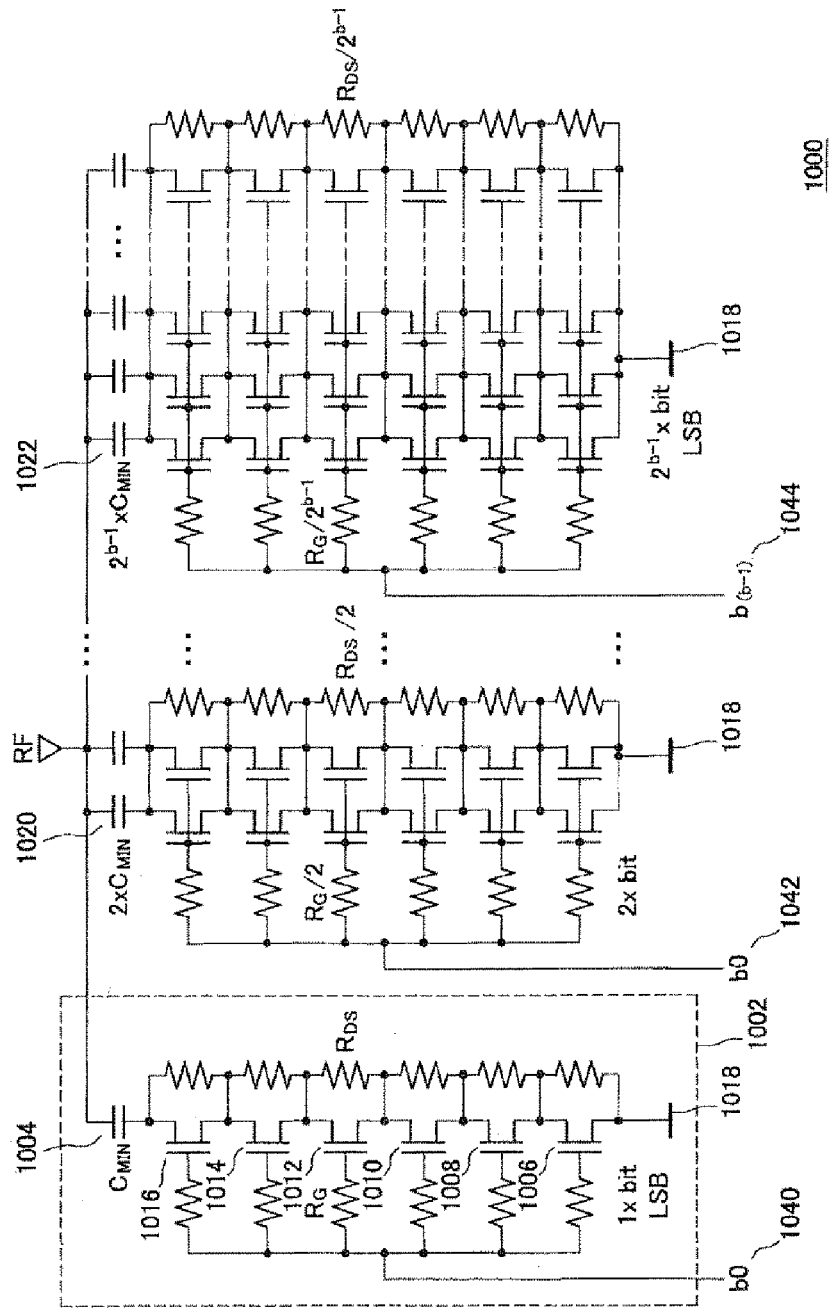
FIG. 1 is a diagram illustrating a conventional integrated circuit 1000 having a variable capacitance element whose capacitance is variable by digital signal control.

Exemplary embodiments of the present invention will now be described in detail with reference to the accompanying drawings.

As set forth above, according to embodiments of the invention, it is possible to provide a novel and improved integrated circuit capable of preventing an element from being damaged even when a high level signal is input to an integrated circuit having a variable capacitance element whose capacitance is variable by digital signal control.

While the present invention has been explained and described in connection with the exemplary embodiments, it will be apparent to those skilled in the art that modifications and variations can be made without departing from the spirit and scope of the invention as defined by the accompanying claims.

Hereinafter, preferred embodiments of the present invention will be described in detail with reference to the accompanying drawings. Note that, in this specification and the accompanying drawings, configuration elements that have substantially the same function and configuration are denoted with the same reference numerals, and repeated explanation of these configuration elements will be omitted.

1. PROBLEM OF RELATED ART

Before describing preferred embodiments of the present invention, a configuration of a conventional integrated circuit having a variable capacitance element whose capacitance is variable by digital signal control, and problems of the integrated circuit will be explained. After describing the problems of the related art, preferred embodiments of the present invention will be described in detail.

FIG. 1 is a diagram illustrating a conventional integrated circuit 1000 having a variable capacitance element whose capacitance is variable by digital signal control. As illustrated in FIG. 1, the conventional integrated circuit 1000 having the variable capacitance element includes a plurality of stacked switching FETs that are connected to a MIM capacitor having capacitance $C_{MIM}$ in series. b-bit control signals are supplied to the integrated circuit 1000 in bit units of b0, b1, . . . , and $b_{(b-1)}$, and the total capacitance of the integrated circuit 1000 is determined by these control signals. As illustrated in FIG. 1, the integrated circuit 1000 is provided between an RF terminal and a ground terminal.

MIM capacitors 1004, 1020 and 1022 are designed to have the same capacitance $C_{MIM}$. When the switching FET that has received the control signal b0 is turned on, electric charges are accumulated in the MIM capacitor connected in series.

Similarly, when the switching FET that has received the control signal b1 is turned on, electric charges are accumulated in the MIM capacitor connected in series, and the capacitance of the MIM capacitor is twice ($2 \times C_{MIM}$) larger than the capacitance when the switching FET is turned on by the control signal b0. When the subsequent control signals are applied, the integrated circuit 1000 is configured to respectively accumulate electric charges corresponding to capacitance four times ($4 \times C_{MIM}$), capacitance eight times ($8 \times C_{MIM}$), . . . , and capacitance $2^{b-1}$ times ($2^{b-1} \times C_{MIM}$) larger than the capacitance when the switching FET is turned on by the control signal b0. Here, the integrated circuit can change capacitance to be accumulated by changing the values of the b-bit control signals.

A sub-circuit 1002 included in the integrated circuit 1000 has shunt FETs 1006, 1008, 1010, 1012, 1014 and 1016 that are connected to the MIN capacitor 1004 in series and are stacked. In addition, a control line 1040 is connected to each gate of the stacked FETs with a gate resistor $R_G$ interposed therebetween. A least significant bit (LSB) of the b-bit control signals is supplied to the sub-circuit 1002 from the control line 1040, and the shunt FETs 1006, 1008, 1010, 1012, 1014 and 1016 are controlled to be turned on or off by the LSB control signal. In addition, a drain and source resistor $R_{DS}$ is provided between a drain and a source of each of the shunt FETs 1006, 1008, 1010, 1012, 1014 and 1016. The MIM capacitor 1004 and a ground contact point 1018 are connected by the drain and source resistors $R_{DS}$ that are connected in series.

Although the integrated circuit 1000 having the configuration has a merit in that capacitance to be accumulated can be changed by changing the values of the b-bit control signals, there are the following problems.

Figure 2:
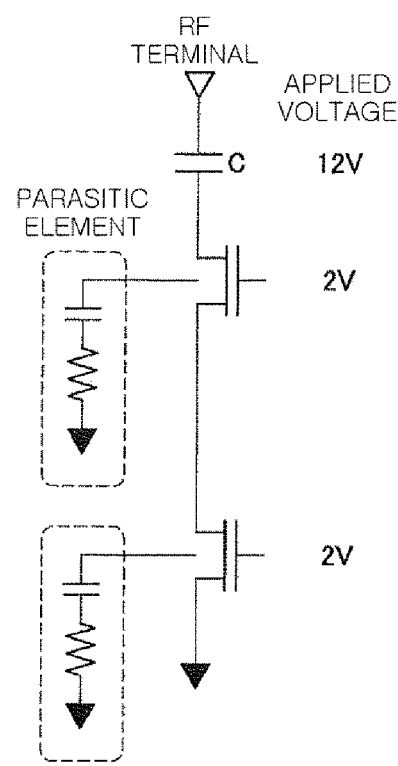
FIG. 2 is a schematic diagram of a sub-circuit 1002 of the integrated circuit 1000 illustrated in FIG. 1.

FIG. 2 is a schematic diagram of the sub-circuit 1002 of the integrated circuit 1000 illustrated in FIG. 1, and illustrates a voltage distribution when a signal having signal amplitude of 15V is input to an input terminal. Here, it is assumed that a withstand voltage of the MIM capacitor is 5V, and a withstand voltage of the FET is 4V. FIG. 2 illustrates only two FETs.

Although capacitance exists between the source and the drain of each FET, the voltage distribution is non-uniformed by a parasitic element existing in the FET.

In the sub-circuit 1002 illustrated in FIG. 2, when the signal having signal amplitude of 15V is input to the RF terminal of the input terminal, a voltage of about 12V may be applied to the MIM capacitor. Since the withstand voltage of the MIM capacitor is about 5V, when such a high level signal is input to the RF terminal of the input terminal, there is a concern that the capacitor is damaged.

Thus, in preferred embodiments to be described below, even when such a high level signal is input to the RF terminal of the input terminal, an integrated circuit for preventing the capacitor or the FET being damaged will be explained.

2. EMBODIMENT OF PRESENT INVENTION

Configuration of Integrated Circuit

Figure 3:
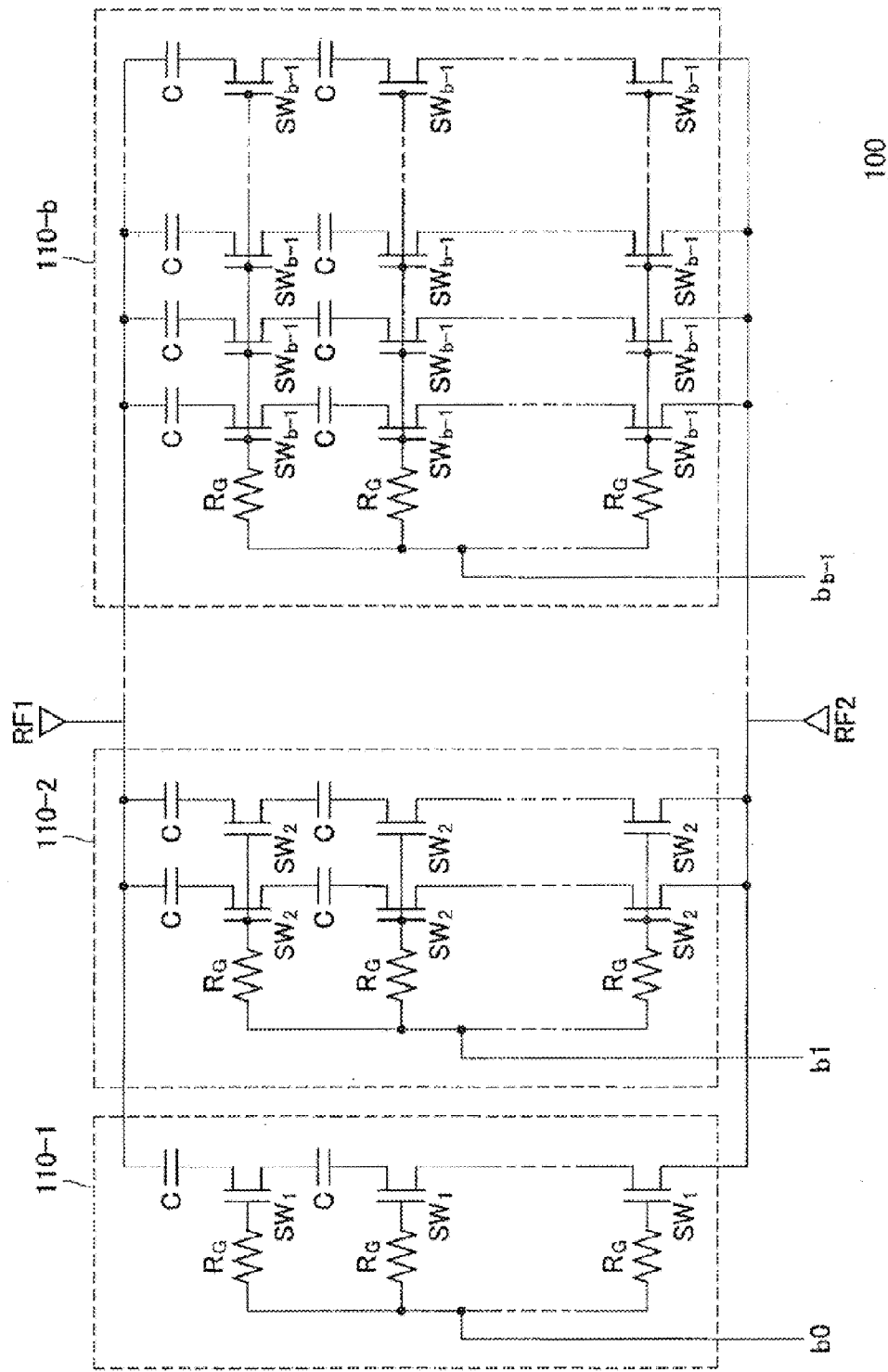
FIG. 3 is a diagram illustrating a configuration of an integrated circuit 100 according to an embodiment of the present invention.

FIG. 3 is a diagram illustrating a configuration of an integrated circuit 100 according to an embodiment of the present invention. The integrated circuit 100 illustrated in FIG. 3 is an integrated circuit whose capacitance is variable by digital signal control. Hereinafter, the configuration of the integrated circuit 100 according to the embodiment of the present invention with reference with FIG. 3 will be explained.

As illustrated in FIG. 3, the integrated circuit 100 according to the embodiment of the present invention includes a plurality of stacked switching FETs that are connected to MIM capacitors having capacitance C in series. b-bit control signals are supplied to the integrated circuit 100 in bit units of b0, b1, . . . , and $b_{(b-1)}$, and the total capacitance of the integrated circuit 100 is determined by these control signals. As illustrated in FIG. 3, the integrated circuit 100 is provided between an RF terminal RF1 and a ground terminal RF2. A signal received by an antenna (not illustrated) is supplied to the RF terminal RF1. Further, in the present invention, the terminal RF2 may be connected to a port or a terminal that is not grounded.

The switching FETs are stacked to be suitable for high power processing requirements in the GSM standard or the WCDMA standard, for example. In the GSM standard or the WCDMA standard, power processing is required to be performed at about +30 dBM to about +35 dBm, and a configuration is required to withstand a voltage of about 10V to about 15V when converted into signal amplitude.

The integrated circuit 100 includes sub-circuits 110-1, 110-2, . . . , and 110-b. In the sub-circuit 110-1, a MIM capacitor is provided at an input terminal of the RF terminal RF1, and another MIM capacitor is provided at a position interposing a switching FET $SW_1$ from the MIM capacitor. Although not illustrated in FIG. 3, the MIM capacitors and the switching FETs $SW_1$ may be alternately connected in series up to an output terminal of the ground terminal RF2.

In the sub-circuit 110-1, the switching FETs $SW_1$ are all turned on or off by supplying a least significant bit (LSB) signal b0 of b-bit control signals via the gate resistors $R_G$. When the switching FETs SW' of the sub-circuit 110-1 are all turned on, electric charges can be accumulated in the MIM capacitors of the sub-circuit 110-1.

The sub-circuit 110-2 has a configuration including two sub-circuits 110-1 connected in parallel between the RF terminal RF1 and the ground terminal RF2. Subsequent sub-circuits each have a configuration including three sub-circuits 110-1, four sub-circuits 110-1, . . . , or (b−1) sub-circuits 110-1 that are connected in parallel.

The MIM capacitors C are designed to have the same capacitance. When the switching FET that has received the control signal b0 is turned on, electric charges are accumulated in the MIM capacitors connected in series. Similarly, when the switching FET that has received the control signal b1 is turned on, electric charges are accumulated in the MIM capacitors connected in series, and capacitance of the MIM capacitors is twice (2×C) larger than the capacitance when the switching FET is turned on by the control signal b0. When subsequent control signals are applied, the integrated circuit 100 is configured to accumulate electric charges corresponding to capacitance four times (4×C), capacitance eight times (8×C), ..., and capacitance $2^{b-1}$ times ($2^{b-1}$×C) larger than the capacitance when the switching FET is turned on by the control signal b0. Here, the integrated circuit can change capacitance to be accumulated by changing the values of the b-bit control signals.

As described above, the configuration of the integrated circuit 100 according to the embodiment of the present invention has been described with reference to FIG. 3. Next, an operation of the integrated circuit 100 according to the embodiment of the present invention will be explained.

[Operation of Integrated Circuit]

As described above, b-bit control signals are supplied to the integrated circuit 100 in bit units of b0, b1, ..., and $b_{(b-1)}$, and the total capacitance of the integrated circuit 100 is determined by these control signals.

For example, when the shunt FETs of the sub-circuit 110-1 are turned on by only the LSB b0 and the shunt FETs of other sub-circuits are turned off, the integrated circuit 100 can accumulate electric charges in only the plurality of MIM capacitors that is provided in the sub-circuit 110-1.

When the shunt FETs of the sub-circuit 110-2 are turned on by only the second bit b1 from the LSB and the shunt FETs of other sub-circuits are turned off, the integrated circuit 100 can accumulate electric charges in only the plurality of MIM capacitors that is provided in the sub-circuit 110-2. In such a case, the integrated circuit 100 can accumulate capacitance twice larger than the capacitance when the shunt FETs of the sub-circuit 110-1 are turned on by only the LSB b0.

In order to accumulate electric charges corresponding to capacitance three times larger than the capacitance when the shunt FETs of the sub-circuit 110-1 are turned on by only the LSB b0, the integrated circuit 100 controls the shunt FETs of the sub-circuit 110-1 and the sub-circuit 110-2 to be turned on by the LSB b0 and the second bit b1 from the LSB. Similarly, in order to accumulate electric charges corresponding to capacitance four times larger than the capacitance when the shunt FETs of the sub-circuit 110-1 are turned on by only the LSB b0, the integrated circuit 100 controls the shunt FETs of the sub-circuit to be turned on by third bit b2 from the LSB.

In this way, by supplying the b-bit control signals to the sub-circuits 110-1, 110-2, ..., and 110-b while changing the b-bit control signals in bit units, the integrated circuit 100 according to the present embodiment can change capacitance using the capacitance when the shunt FETs of the sub-circuit 110-1 are turned on as a reference. Even when the shunt FETs are all turned off, since there actually exists parasitic capacitance of the shunt FETs, the integrated circuit 100 according to the present embodiment can change capacitance using the parasitic capacitance thereof as a base.

Unlike the conventional integrated circuit 1000, the integrated circuit 100 according to present embodiment is configured such that at least two MIM capacitors interpose a shunt FET in one sub-circuit. In this way, by interposing a shunt FET between at least two MIM capacitors in one sub-circuit, even when a signal having high voltage amplitude is supplied to the RF terminal RF1, it is possible to prevent the element from being damaged.

Figure 4:
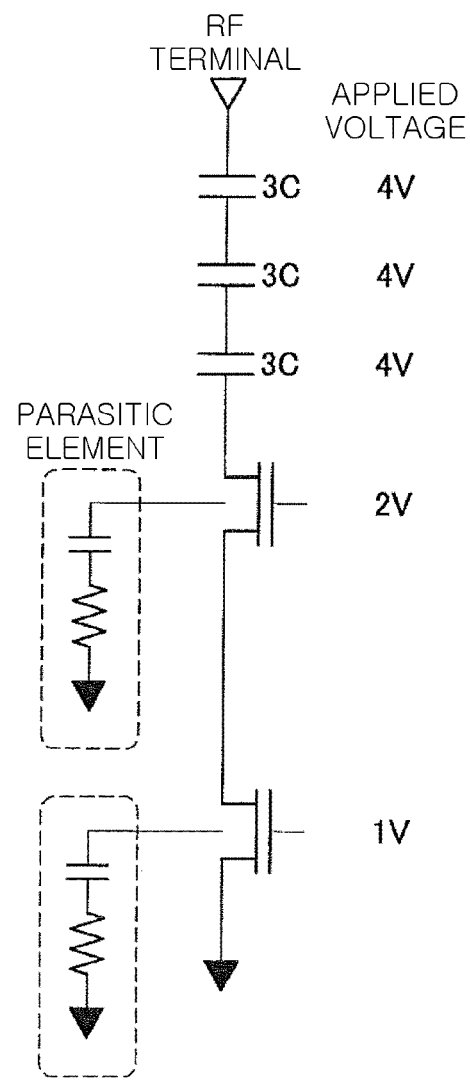
FIG. 4 is a diagram illustrating voltages applied to MIM capacitors and stacked FETs.

Voltages applied to the MIM capacitors and the stacked FETs will be described below. FIG. 4 is a diagram illustrating voltages applied to the MIM capacitors and the stacked FETs, and illustrates a state where three MIM capacitors are connected in series between the RF terminal RF1 of the input terminal and the ground terminal RF2 of the output terminal, and two shunt FETs are connected in series thereto. Here, it is assumed that a withstand voltage of the MIM capacitor is 5V, and a withstand voltage of the FET is 4V. FIG. 4 illustrates only two shunt FETs for convenience' shake.

As illustrated in FIG. 4, when the MIM capacitors and the shunt FETs are connected in series and a signal having voltage amplitude of 15V is input to the RF terminal RF1 of the input terminal, for example, a voltage each applied to the MIM capacitors is 4V, a voltage applied to the shunt FETs of the former part is 2V, and a voltage applied to the shunt FETs of the latter part is 1V.

As illustrated in FIG. 4, when the MIM capacitors and the shunt FETs are connected in series, since the voltages applied to the MIM capacitors are divided when compared to a case illustrated in FIG. 2, it is possible to prevent the MIM capacitors being damaged. However, a balance between the voltages applied to the MIM capacitors and the voltages applied to the shunt FETs is degraded, and voltages are hardly applied to the shunt FETs, so that a withstand voltage margin of the MIM capacitor decreases.

Accordingly, as illustrated in FIG. 3, by alternately connecting the MIM capacitors and the shunt FETs in series, it is possible to improve a balance the voltages applied to the MIM capacitors and the voltages applied to the shunt FETs, and to increase a withstand voltage margin of each element.

Figure 5:
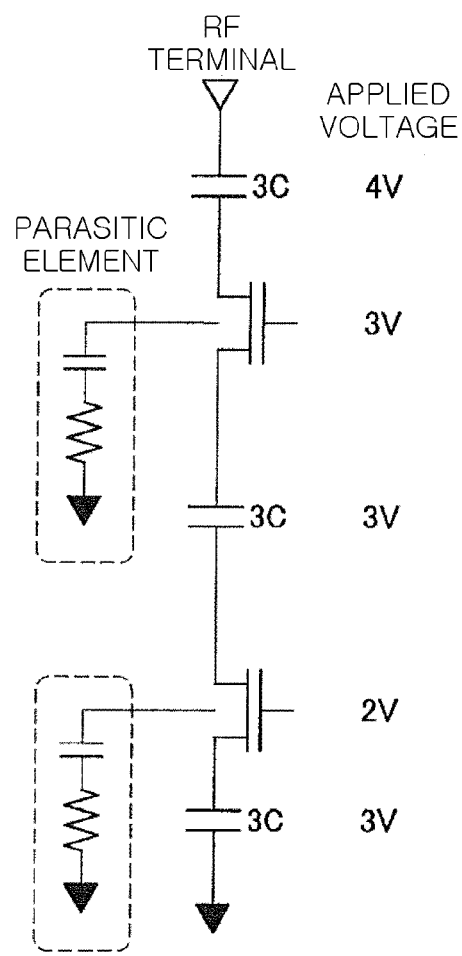
FIG. 5 is a diagram illustrating voltages applied to MIM capacitors and stacked FETs.

FIG. 5 is a diagram illustrating voltages applied to the MIM capacitors and the stacked FETs, and is a schematic diagram of the sub-circuit 110-1 of the integrated circuit 100 illustrated in FIG. 3. FIG. 5 illustrates a state where three MIM capacitors are connected in series between the RF terminal RF1 of the input terminal and the ground terminal RF2 of the output terminal, and shunt FETs are interposed between the MIM capacitors, respectively. Here, it is assumed that a withstand voltage of the MIM capacitor is 5V, and a withstand voltage of the FET is 4V. FIG. 5 illustrates only two shunt FETs for convenience shake As illustrated in FIG. 5, when the MIM capacitors and the shunt FETs are connected in series and a signal having signal amplitude of 15V is input to the RF terminal RF1 of the input terminal, for example, voltages applied to the MIM capacitors are 4V, 3V, and 3V in order close to the RF terminal RF1, and voltages applied to the shunt FETs are 3V, and 2V in order close to the RF terminal RF1.

As illustrated in FIG. 5, by alternately connecting the MIM capacitors and the shunt FETs, the voltage is applied to the shunt FET. Thus, in each sub-circuit of the integrated circuit 100, the MIM capacitors and the shunt FETs are alternately connected as illustrated in FIG. 5, so that a withstand voltage margin of each element increases. The integrated circuit 100 illustrated in FIG. 3 may be applied to a wireless communication apparatus that performs wireless communication according to the GSM standard or the WCDMA standard, which is required to perform power processing at about +30 dBm to +35 dBm and to withstand a voltage of about 10V to about 15V when converted into signal amplitude

3. CONFIGURATION OF WIRELESS COMMUNICATION APPARATUS

Figure 6:
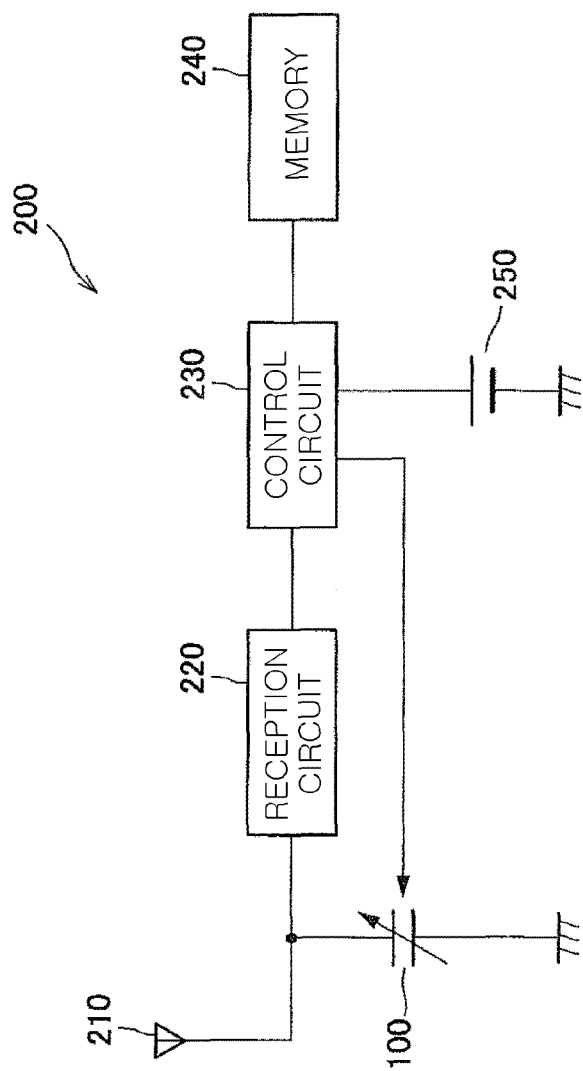
FIG. 6 is a diagram illustrating a configuration of a wireless communication apparatus 200 including the integrated circuit 100 according to the embodiment of the present invention.

Next, a configuration example of a wireless communication apparatus including the integrated circuit 100 illustrated in FIG. 3 will be described. FIG. 6 is a diagram illustrating a configuration of a wireless communication apparatus 200 including the integrated circuit 100 according to the embodiment of the present invention illustrated in FIG. 3. Hereinafter, a configuration of a wireless communication apparatus 200 including the integrated circuit 100 according to the embodiment of the present invention with reference to FIG. 6.

The wireless communication apparatus illustrated in FIG. 6 performs wireless communication according to, for example, the GSM standard or the WCDMA standard. As illustrated in FIG. 6, the wireless communication apparatus 200 includes the integrated circuit 100 having a variable capacitive element, an antenna 210, a reception circuit 220, a control circuit 230, a memory 240, and a battery 250.

The reception circuit 220 performs predetermined reception processing on a signal received by the antenna 210. Examples of the predetermined reception processing performed by the reception circuit 220 include frequency conversion processing, mixing processing, and A/D conversion processing. The reception circuit 220 performs the predetermined reception processing on the signal received by the antenna 210 to supply a digital signal to the control circuit 230.

The control circuit 230 performs various kinds of processing for controlling the wireless communication apparatus 200 based on the digital signal supplied from the reception circuit 220. By reading out a computer program stored in the memory 240 and sequentially executing the read-out program, the control circuit 230 can control an operation of the wireless communication apparatus 200. The control circuit 230 outputs a b-bit control signal for changing storage capacitance of the integrated circuit 100 to the integrated circuit 100. The integrated circuit 100 can change the storage capacitance based on the b-bit control signal supplied from the control circuit 230. The battery 250 stores electric power for operating the control circuit 230, and includes, for example, a secondary battery.

As described above, although the configuration of the wireless communication apparatus 200 including the integrated circuit 100 according to the embodiment of the present invention has been described with reference to FIG. 6, the wireless communication apparatus illustrated in FIG. 6 is merely an example of the wireless communication apparatus including the integrated circuit 100 according to the embodiment of the present invention. The configuration of the wireless communication apparatus including the integrated circuit 100 according to the embodiment of the present invention is not limited to the example.

4. CONCLUSION

As described above, in accordance with the embodiment of the present invention, it is possible to provide the integrated circuit having the variable capacitance element whose capacitance is variable by digital signal control. The integrated circuit is configured such that one sub circuit includes a plurality of MIM capacitors that is connected in series, and shunt FETs interposed between the MIM capacitors to be stacked.

The MIM capacitors and the shunt FETs are alternately connected, and, thus, a voltage is applied to the shunt FETs. Accordingly, in each sub circuit of the integrated circuit 100 according to the embodiment of the present invention, the MIM capacitors and the shunt FETs are alternately connected, so that a withstand voltage margin of each element is high. The integrated circuit 100 according to the embodiment of the present invention may be applied to a wireless communication apparatus that performs wireless communication according to the GSM standard or the WCDMA standard, which is required to perform power processing at about +30 dBm to +35 dBm and to withstand a voltage of about 10V to about 15V when converted into signal amplitude.

As described above, although it has been that the preferred embodiments of the present invention will be described in detail with reference to the accompanying drawings, the present invention is not limited to the embodiments. It will be apparent to those skilled in the art that various modifications or variations can be made without departing from the technical teaching of the present invention within the scope of the claims. In addition, it should be understood that the modifications or variations may be made within the scope of the invention.

What is claimed is:

1. An integrated circuit, comprising:
    b sub-circuits (b is an integer equal to or greater than 1) that are connected in series between a first terminal and a second terminal and have capacitance $2^{b-1}$ times larger than predetermined unit capacitance,
    wherein the b-th sub-circuit includes $2^{b-1}$ configurations, which are connected in parallel, each including at least two capacitors connected in series and at least two stacked switch elements,
    at least the two stacked switch elements are operated to all switched for each sub-circuit, and
    at least one switch element of at least the two stacked switch elements is provided between at least the two capacitors.

2. The integrated circuit according to claim 1, wherein one of at least the two capacitors is provided at a position closest to the first terminal.

3. The integrated circuit according to claim 1, wherein the second terminal is connected to ground potential.

4. A wireless communication apparatus including the integrated circuit according to claim 1.

* * * * *